US008754415B2

(12) United States Patent
Kwack et al.

(10) Patent No.: US 8,754,415 B2
(45) Date of Patent: Jun. 17, 2014

(54) HIGH LIGHT TRANSMITTANCE IN-PLANE SWITCHING LIQUID CRYSTAL DISPLAY DEVICE AND METHOD FOR MANUFACTURING THE SAME

(71) Applicant: LG Display Co., Ltd., Seoul (KR)

(72) Inventors: Heeyoung Kwack, Paju-si (KR); Heunglyul Cho, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 77 days.

(21) Appl. No.: 13/687,720

(22) Filed: Nov. 28, 2012

(65) Prior Publication Data

US 2013/0087797 A1   Apr. 11, 2013

Related U.S. Application Data

(62) Division of application No. 12/976,479, filed on Dec. 22, 2010, now Pat. No. 8,450,744.

(30) Foreign Application Priority Data

Nov. 3, 2010 (KR) .......................... 10-2010-0108586

(51) Int. Cl.
*H01L 33/00* (2010.01)

(52) U.S. Cl.
USPC .. 257/59; 257/72; 257/E21.535; 257/E27.111

(58) Field of Classification Search
CPC .............. H01L 27/1214; H01L 29/458; H01L 29/4908; H01L 27/124; H01L 27/3262; H01L 27/3272; H01L 27/3276; H01L 29/41733
USPC ....................... 257/59, 72, E21.535, E27.111
See application file for complete search history.

(56) References Cited

U.S. PATENT DOCUMENTS

2005/0041170 A1*  2/2005  Chae ................................ 349/43
2008/0284967 A1* 11/2008  Oh et al. ........................ 349/144

* cited by examiner

*Primary Examiner* — Cathy N Lam
(74) *Attorney, Agent, or Firm* — Mckenna, Long & Aldridge LLP

(57) ABSTRACT

The present disclosure relates to a high light transmittance in-plan switching liquid crystal display device and a method for manufacturing the same. The liquid crystal display device includes: a substrate; a gate line disposed in horizontal direction on the substrate; a gate insulating layer covering the gate line; a data line disposed in vertical direction on the gate insulating layer; an additional insulating layer on the data line having same size and shape with the data line; a passivation layer covering the additional insulating layer; and a common electrode overlapping with the data line on the passivation layer. According to the present disclosure, the failure due to the parasitic capacitance and the load for driving the display panel are reduced and it is possible to make large and high definition display panel.

8 Claims, 8 Drawing Sheets

HIGH LIGHT TRANSMITTANCE IN-PLANE SWITCHING LIQUID CRYSTAL DISPLAY DEVICE AND METHOD FOR MANUFACTURING THE SAME

CROSS-REFERENCE TO RELATED APPLICATIONS

This application is a Divisional of application Ser. No. 12/976,479 filed Dec. 22, 2010, now allowed, which claims priority to Korean Patent Application No. 10-2010-0108586, filed Nov. 3, 2010, all of which are hereby incorporated by reference for all purposes as if fully set forth herein.

BACKGROUND OF THE INVENTION

1. Field of the Invention

The present disclosure relates to a high light transmittance in-plan switching liquid crystal display device and a method for manufacturing the same. Especially, the present disclosure relates to a fringe electric field type liquid crystal display device having a reduced capacitance between data line and common electrode and a method for manufacturing the same.

2. Discussion of the Related Art

The liquid crystal display device represents video data by controlling the light transmitivity of the liquid crystal layer using the electric fields. According to the direction of the electric field, the LCD can be classified in the two major types; one is vertical electric field type and the other is the horizontal electrid field type.

For the vertical electric field type LCD, the common electrode formed on the upper substrate and the pixel electrode formed on the lower substrate are facing with each other for forming the electric field of which direction is perpendicular to the substrate face. The twisted nematic liquid crystal layer disposed between the upper substrate and the lower substrate is driven the vertical electric field. The vertical electric field type LCD has merit of higher aperture ratio, while it has demerit of narrower view angle about 90 degree.

For the horizontal electric field type LCD, the common electrode and the pixel electrode are formed on the same substrate in parallel. The liquid crystal layer disposed between the upper substrate and the lower substrate is driven in In-Plane-Switching (IPS) mode by the electric field parallel to the substrate face. The horizontal electric field type LCD has a merit of wider view angle over 170 degree. In the interim, as the horizontal electric field type LCD has lower aperture ratio, it is required to develop the advanced measures for enhancing the aperture ratio.

SUMMARY OF THE INVENTION

In order to overcome the above mentioned drawbacks, the purpose of the present disclosure is to suggest a high light transmittance in-plan switching liquid crystal display device and a method for manufacturing the same in which the marginal area between the data line and pixel electrode is minimized by shielding the data line with the common electrode to enhance the aperture ratio. Another purpose of the present disclosure is to suggest a high light transmittance in-plan switching liquid crystal display device and a manufacturing method of the same in which the parasitic capacitance is reduced by inserting an additional insulating layer having the low dielectric property between the data line and the common electrode. Still another purpose of the present disclosure is to suggest a high light transmittance in-plan switching liquid crystal display device and a manufacturing method of the same in which the data line material is prevented from being damaged by the additional insulating layer having a low dielectric material.

In order to accomplish the above purpose, the present disclosure suggests a high light transmittance in-plan switching liquid crystal display device comprising: a substrate; a gate line disposed in horizontal direction on the substrate; a gate insulating layer covering the gate line; a data line disposed in vertical direction on the gate insulating layer; an additional insulating layer on the data line having same size and shape with the data line; a passivation layer covering the additional insulating layer; and a common electrode overlapping with the data line on the passivation layer.

The additional insulating layer includes a photo acryl; and the insulating layer includes at least one of silicon nitride and silicon oxide.

The additional insulating layer has a thickness of 1000~2000 Å; and the insulating layer has a thickness of 2000~3000 Å.

The data line includes a copper material.

The device further comprises a protective metal layer having same shape and size with the data line between the data line and the additional insulating layer.

The protective metal layer includes at least one of molibdeium, titanium and chromium.

The protective metal layer has a thickness of 300~500 Å.

The device further comprises a gate electrode branching from the gate line; a channel layer overlapping with the gate electrode on the gate insulating layer; a source electrode branching from the data line and contacting a first side of the channel layer; a drain electrode facing with the source electrode and contacting a second side of the channel layer; and a pixel electrode contacting some portions of the drain electrode and having a rectangular shape within a pixel area defined by the gate line and the data line, wherein the common electrode further includes a comb ribs pattern in which a plurality of segments having a predetermined width are arrayed in parallel with a predetermined gap, within the pixel area.

A manufacturing method of a high light transmittance in-plan switching liquid crystal display device comprising: forming a gate element including a gate line on a transparent substrate; forming a gate insulating layer covering the gate element; forming a data line crossing the gate line on the gate insulating layer to define a pixel area, and an additional insulating layer having same size and shape with the data line and contacting on the data line; forming a passivation layer on the additional insulating layer; and forming a common electrode covering the data line on the passivation layer and including a comb ribs pattern in which a plurality of segments having a predetermined width are arrayed in parallel with a predetermined gap, within the pixel area.

The forming the data line further including a protective metal layer having same shape and size with the data line between the data line and the additional insulating layer.

The forming the gate line further includes forming a gate electrode branching from the gate line; the forming the data line further includes forming a channel layer overlapping with the gate electrode on the gate insulating layer, a source electrode branching from the data line and contacting a first side of the channel layer, and a drain electrode facing with the source electrode and contacting a second side of the channel layer; and after the forming the data line, further comprises: forming a pixel electrode contacting some portions of the drain electrode and having a rectangular shape within a pixel area defined by the gate line and the data line.

The forming the gate line further includes forming a gate electrode branching from the gate line; after forming the gate insulating layer, further comprising forming a channel layer overlapping with the gate electrode on the gate insulating layer; and forming a pixel electrode having a rectangular shape in the pixel area on the gate insulating layer; and wherein the forming the data line further includes forming a source electrode branching from the data line and contacting a first side of the channel layer, and a drain electrode facing with the source electrode and contacting a second side of the channel layer.

In the liquid crystal display device according to the present disclosure, the common electrode overlaps the data lines to shield the data line of which voltage is changed at each time. Therefore, the liquid crystal layer is not affected by the voltage changes of the data line so it is possible to enlarge the aperture ratio as the pixel electrode area can has maximized area. Furthermore, using a photoacryl having the low dielectric property as an additional insulating layer between the data line and the common electrode, the parasitic capacitance can be remarkably reduced. Therefore, the fails due to the parasitic capacitance and the load of the liquid crystal display panel can be reduced, and it is possible to make large area and high definition display panel. Furthermore, when the copper material is used for the data line, by adding a protective metal layer on the copper data line, it is possible to prevent the intersurface problems which can be occurred with the additional insulating layer having a low dielectric material, such as photoacryl. As a result, it is possible to get a high light transmittance in-plan switching liquid crystal display device. Furthermore, using the photoacryl, it is possible to perform a photomask process and to make a low dielectric additional insulating layer by one step process without any separated processes. Therefore, we can get a manufacturing method in which the manufacturing process is simplified and the manufacturing cost is lowered.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
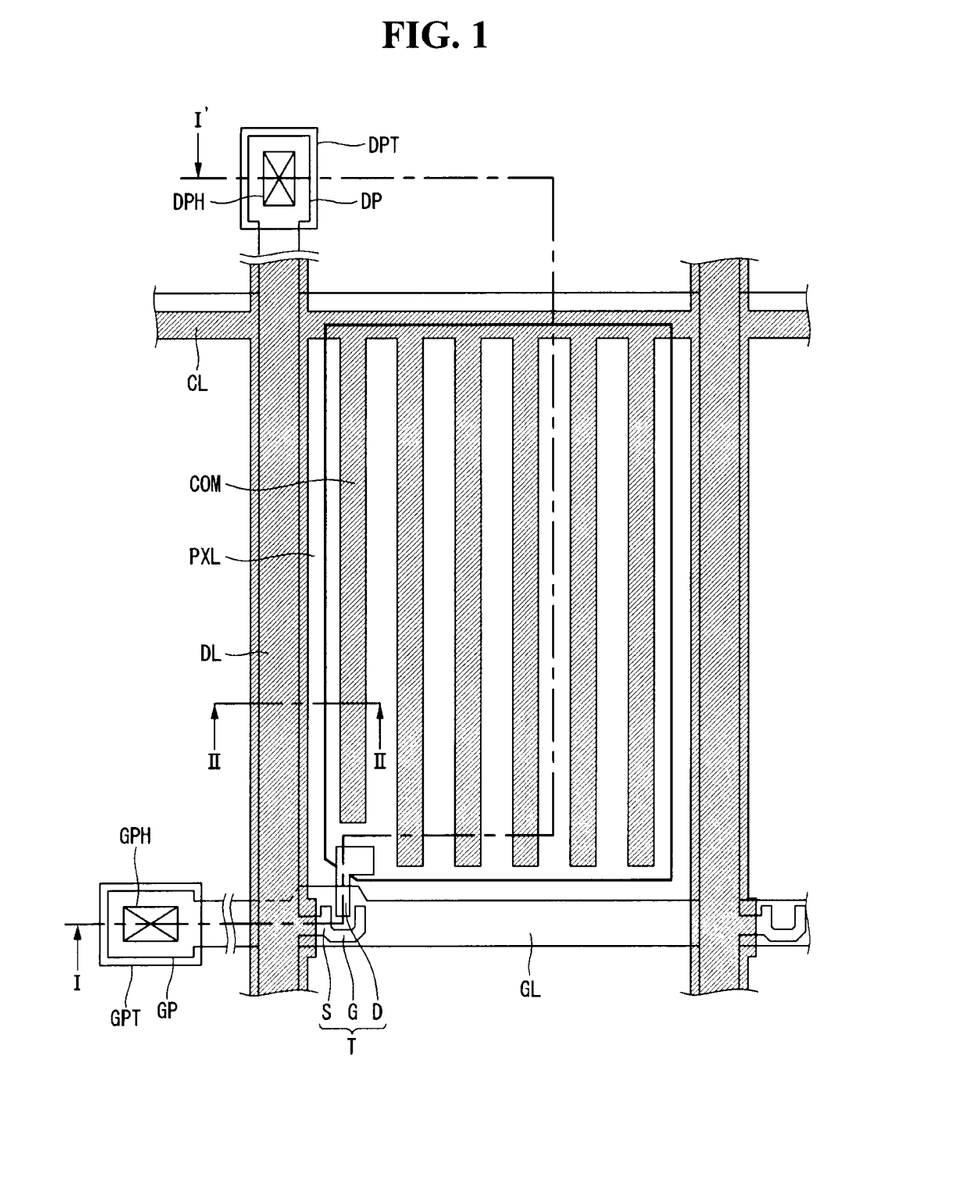
FIG. 1 is a plane view illustrating the horizontal electric field type liquid crystal display device according to the present disclosure.

Referring to attached figures including FIGS. 1 to 6b, we will explain preferred embodiments of the present disclosure. FIG. 1 is a plane view illustrating the horizontal electric field type liquid crystal display device according to the present disclosure.

Referring to FIG. 1, the horizontal electric field type liquid crystal display device according to the present disclosure comprises a liquid crystal display panel having two glass substrates and a liquid crystal layer inserted between the two glass substrates. The liquid crystal display panel comprises a thin film transistor array substrate having a plurality of thin film transistor, and a color filter array substrate having a plurality of color filter. For the liquid crystal display panel according to the first embodiment, the thin film transistor substrate is mainly used for the explanation.

The thin film transistor array substrate according to the present disclosure includes a gate line GL running along the horizontal direction and a data line DL running along the vertical direction on a glass substrate SUB. The rectangular shapes formed by the crossing structure of the gate line GL and the data line DL defines a plurality of pixel area. At one corner of each pixel areas, a thin film transistor T having a gate electrode G branching from the gate line GL, a source electrode S branching from the data line DL and a drain electrode D facing with the source electrode S apart from the source electrode S with a predetermined distance is formed.

The drain electrode D is connected to a pixel electrode PXL corresponding to the inner area of the pixel area. The pixel electrode PXL is covered by a passivation layer PAS and a common electrode COM overlapping with the pixel electrode PXL is formed on the passivation layer PAS. Especially, the common electrode COM has a comb rib pattern in which a plurality of segments having a predetermined width is arrayed in parallel with a predetermined gap. To each pixel electrode PXL, a pixel voltage is supplied via the data line DL according to operation of the thin film transistor T. And, to the common electrode COM, a reference voltage for driving the liquid crystal molecules are supplied. Therefore, a fringe electric field is formed between the pixel electrode PXL and the common electrode COM. Due to the horizontal fringe electric field, the liquid crystal molecules are driven in In-Plan Switching mode.

Especially, in order to maximize the aperture ratio, the liquid crystal display panel according to the present disclosure has a structure in which the common electrode COM is overlapping and covering the data line DL thereon. That is, the common electrode COM having the constant reference voltage shields the data line DL having a data voltage changing time to time. Therefore, the voltage changing of the data line DL can not affect to the electric field formed between the pixel electrode PXL and the common electrode COM. Furthermore, as a horizontal electric field is formed between the common electrode COM located at the circumference of the pixel area over the data line DL and the pixel electrode PXL located within the pixel area, the horizontal electric field is formed overall area of the pixel area.

According to the present disclosure, there are at least two methods for manufacturing the liquid crystal display panel as mentioned above. At first, referring to FIGS. 2A to 2F, the first embodiment for manufacturing the liquid crystal display panel will be explained. FIGS. 2A to 2F are cross-sectional views illustrating the steps of manufacturing the horizontal electric field type liquid crystal display panel of FIG. 1 by cutting along the line I-I', according to the first embodiment of the present disclosure.

Figure 2A:
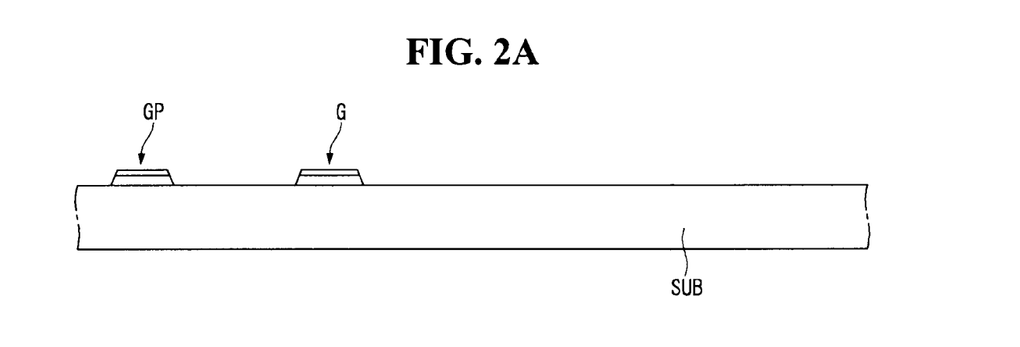
FIGS. 2A to 2F are cross-sectional views illustrating the steps of manufacturing the horizontal electric field type liquid crystal display panel of FIG. 1 by cutting along the line I-I', according to the first embodiment of the present disclosure.

As shown in FIG. 2A, on a transparent substrate SUB, a metal material is deposited and patterned using a first mask process to form gate elements. The gate elements includes a gate line GL running in horizontal direction on the substrate SUB, a gate electrode G protruding from the gate line GL into the pixel area, and a gate pad GP formed at one end of the gate line GL. Especially, the gate elements comprise a first metal layer having copper (Cu) for low electric resistance, and a second metal layer on the first metal layer for protecting the copper material of the first metal layer.

Figure 2B:
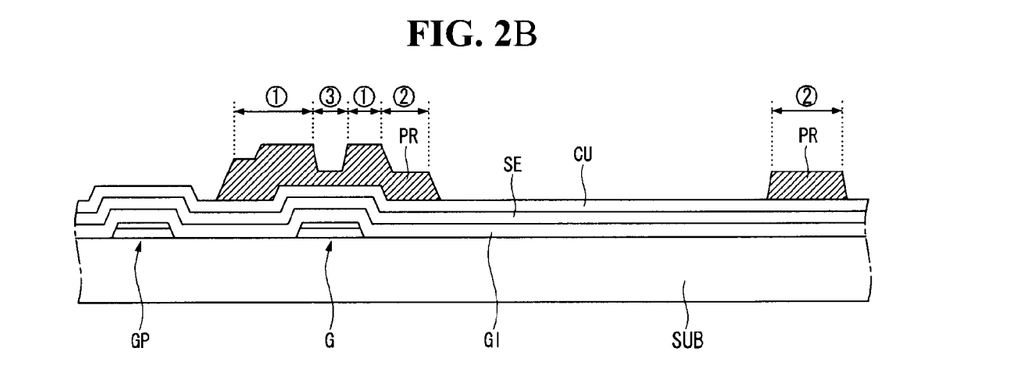

As shown in FIG. 2B, on the whole surface of the substrate SUB having the gate elements, a gate insulating layer GI, a semiconductor material SE and a source-drain metal material CU are sequentially deposited. On the source-drain metal material CU, a photo acryl material is deposited. Using a second mask process, the photo acryl pattern PR is formed. In the second mask process, a half-tone mask including 3 regions is used. As a result, the photo acryl pattern PR having three regions is formed in a manner that the first region has the highest thickness, the third region has the lowest thickness, and the second region has middle thickness. At the first region ①, the source-drain metal material CU, the semiconductor material SE and the photo acryl will be remained. At the second region ②, the source-drain metal material CU and the semiconductor material SE will be remained. At the third region ③, only the semiconductor material SE will be remained.

Using the photo acryl pattern PR, the source-drain metal material CU and the semiconductor material SE are patterned. After that, the photo acryl pattern PR is thinned by ashing the photo acryl pattern PR to remove the thickness of the third region ③. Then, the first region ① and the second region ② of the photo acryl pattern PR has the thickness which is subtracted with the thickness of the third region ③. At the third region ③, the photo acryl pattern PR is removed so that the source-drain metal material CU is exposed. In this situation, etching process is further performed to remove the exposed source-drain metal material CU. Then, a source electrode S and a drain electrode D are formed, and a channel layer is completed between the source electrode S and the drain electrode D. After that, using further ashing process, the remained photo acryl pattern PR is thinned by removing the thickness of remained second region ②. That is, the photo acryl pattern of the first region ① has a thickness thinner than the original thickness by subtracting with the original thickness of the second region ②.

Figure 2C:
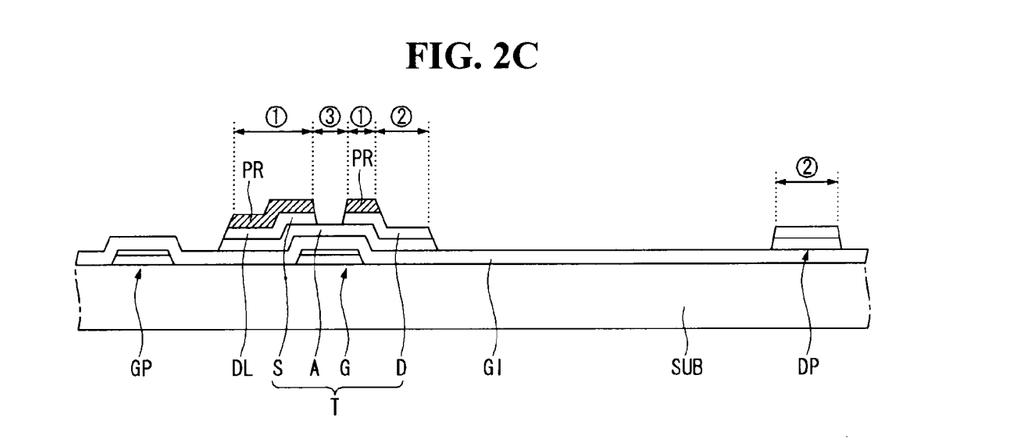

As shown in FIG. 2C, at the first region ①, the thinned photo acryl pattern PR is still remained, while some portions of the drain electrode D is exposed at the second region ②, and the semiconductor layer A is exposed at the third region ③. As a result, a semiconductor layer A overlapping with the gate electrode G, a data line DL running in vertical direction on the substrate SUB, a source electrode S branching from the data line DL and contacting to one side of the semiconductor layer A, a drain electrode D facing with the source electrode and contacting with the other side of the semiconductor layer A, and a data pad DP formed at one end of the data line DL are formed. In the interim, on the data line DL, the source electrode S and some portions of the drain electrode D, thinned photo acryl pattern PR is remained to form an additional insulating layer. Here, it is preferable for the finally remained thinned photo acryl pattern PR to have a thickness of 1000~2000 Å in order to be an additional insulating layer shielding the data line DL.

Figure 2D:
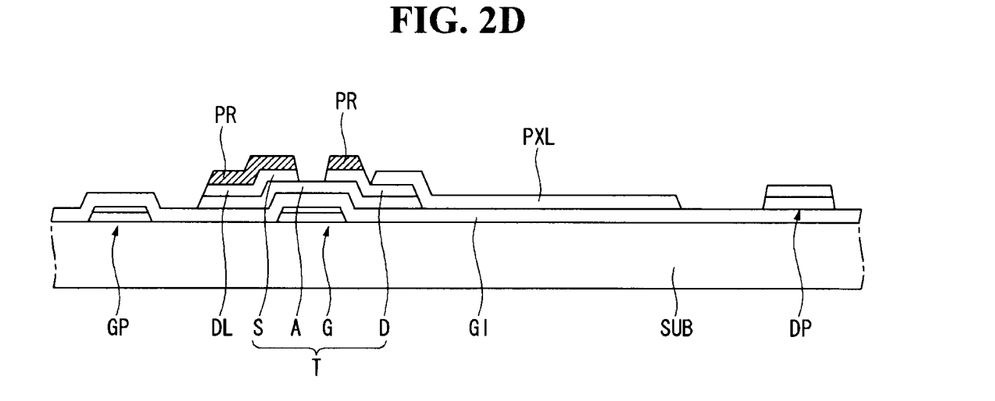

On the substrate SUB having the thin film transistor T, a transparent conductive material such as ITO (Indium Tin Oxide) and IZO (Indium Zinc Oxide) is deposited and patterned by the third mask process to form a pixel electrode PXL. The pixel electrode PXL has a rectangular shape covering over all areas of the pixel area. Especially, the pixel electrode PXL is directly contact the upper surface and the etched side surfaces of the drain electrode D exposed by the photo acryl pattern PR, as shown in FIG. 2D.

Figure 2E:
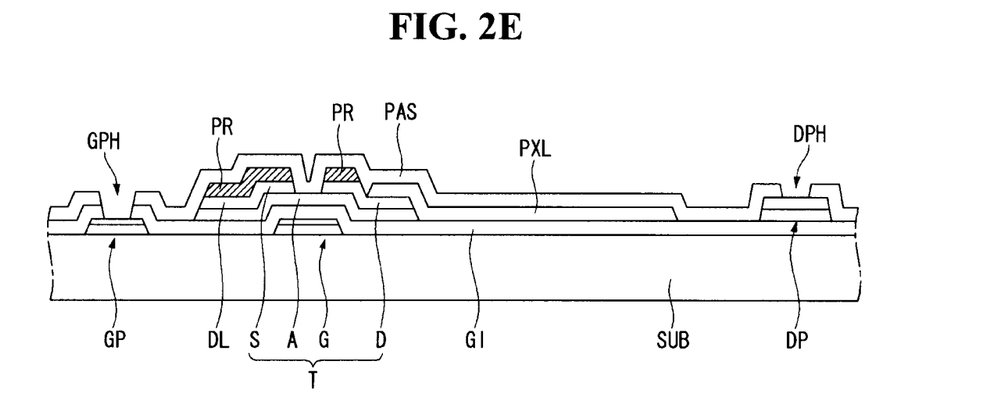

On the substrate SUB having the pixel electrode PXL, an inorganic insulating material such as silicon nitride (SiNx) and silicon oxide (SiOx) is deposited with a thickness of 1000~3000 Å to form a passivation layer PAS. Using the fourth mask process, the passivation layer PAS and the gate insulating layer GI are patterned. By removing some portions of the passivation layer PAS and the gate insulating layer GI covering the gate pad GP, a gate contact hole GPH exposing the gate pad GP is formed. At the same time, removing some portions of the passivation layer PAS covering the data pad DP, a data pad contact hole DPH exposing the data pad DP is formed, as shown in FIG. 2E.

Figure 2F:
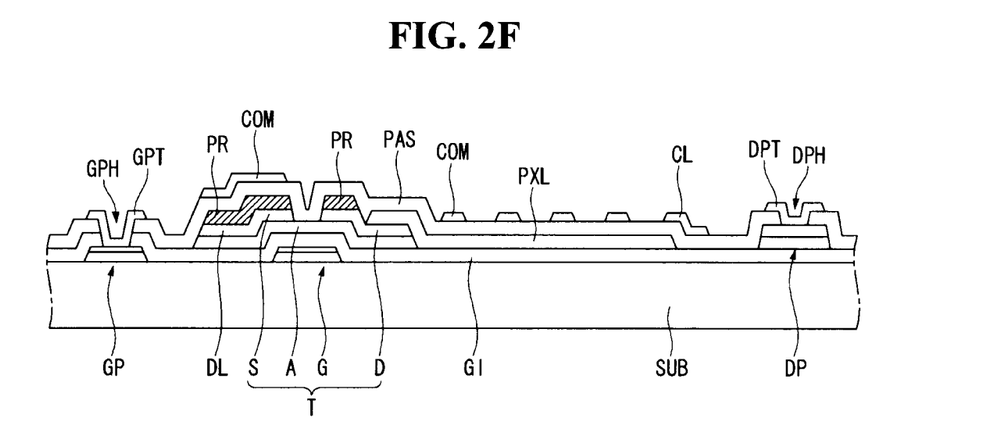

Referring to FIG. 2F, on the whole surface of the substrate SUB, a transparent conductive material such as ITO (Indium Tin Oxide) and IZO (Indium Zinc Oxide) is deposited and patterned using the fifth mask process to form a common electrode COM, a gate pad terminal GPT and a data pad terminal DPT. The gate pad terminal GPT is connected to the gate pad GP via the gate pad contact hole GPH. The data pad terminal DPT in connected to the data pad DP via the data pad contact hole DPH. The common electrode COM has a segment portion completely covering the data line DL and a plurality of segments having a predetermined width and parallelly arrayed each other with a predetermined gap within the pixel area. The common electrode COM has a structure comparing a plurality of comb pattern ribs. Furthermore, the common electrode COM is branching from a common line CL running in parallel with the gate line GL.

In the explanation for the first embodiment, the method for manufacturing the fringe type horizontal electric field liquid crystal display panel comprises the five mask processes. Especially, the photo acryl pattern PR, the additional insulating layer, is the photoresist material used in a photo-etching process, therefore the additional insulating layer can be formed without any additional manufacturing step. As a result, the manufacturing process can be simplified and the manufacturing cost is not increased.

Figure 4:
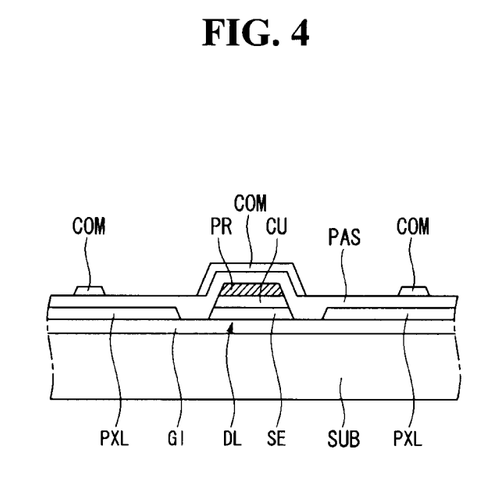
FIG. 4 is an enlarged cross-sectional view illustrating a structure of the data line of the horizontal electric field liquid crystal display panel of FIG. 1 by cutting along the line II-II', according to the first embodiment of the present disclosure.

Furthermore, the portion having the data line DL in the horizontal electric field type liquid crystal display panel according to the first embodiment will be explained in detail. FIG. 4 is an enlarged cross-sectional view illustrating a structure of the data line of the horizontal electric field liquid crystal display panel of FIG. 1 by cutting along the line II-II', according to the first embodiment of the present disclosure.

Within the pixel area on the substrate SUB, the gate elements and the source-drain elements are formed having a gate insulating layer GI therebetween. As shown in FIG. 4, the data line DL is formed on the gate insulating layer GI, and the pixel electrodes PXL are formed in the pixel areas at the left and right sides of the data line DL. In the first embodiment, as the source-drain elements are formed by simultaneously patterning the semiconductor material SE and the source-drain metal material CU, the data line DL has the double layer structure. On the upper surface of the data line DL, the photo acryl pattern PR having the photo acryl material is disposed. On the photo acryl pattern PR, a passivation layer PAS is formed to cover all surfaces of the substrate SUB. On the passivation layer PAS, the common electrode COM is formed as covering the data line DL completely. Within the pixel area, the common electrode COM is overlapping with the pixel electrode PXL. Therefore, due to the fringe field formed between the common electrode COM and the pixel electrode PXL, the horizontal electric field is formed on the substrate SUB.

With this structure, at the outer edge portions of the pixel electrode, the horizontal electric field formed between the common electrode COM overlapping the data line DL and the pixel electrode PXL is used for driving the liquid crystal molecules. Therefore, it is possible to maximize the aperture ratio. Furthermore, as the data line DL is shielded by the common electrode COM, the voltage signal fluctuation occurred by the data line DL cannot affect to the liquid crystal molecules. Consequently, it is also paticitate to maximize the aperture ratio of the horizontal electric field type liquid crystal display panel according to the present disclosure.

When the data line DL and the common electrode COM are overlapped, parasitic capacitances may be formed therebetween, so the load for driving the liquid crystal display panel will be increased. Due to the increased load, it is hard to apply for manufacturing larger display panels having this structure. In order to reduce the parasitic capacitance, the thickness of the passivation layer PAS inserted between the data line DL and the common electrode COM should be thicker and thicker. As increasing the thickness of the passivation layer PAS, the distance between the pixel electrode PXL and the common electrode COM is also increased. Therefore, the driving power consumption should be increased.

In the first embodiment, the photo acryl pattern PR is disposed on the data line DL. The photo acryl has the dielectric property of 3~4 F/m which is lower than the dielectric property of the passivation layer PAS material such as SiNx, i.e. the dielectric property of the photo acryl is about half of that of the SiNx. Therefore, the photo acryl pattern PR having the thickness of 3000 Å has the same performance with the passivation layer PAS having the thickness of 6000 Å. More preferably, the photo acryl pattern PR would have thickness of 1000~2000 Å and the passivation layer PAS would have thickness of 2000~3000 Å. In this case, the insulating distance between the data line DL and the common electrode COM is 3000~5000 Å while the net dielectric property is about 4 F/m, so that it is possible to minimize the parasitic capacitance. At the same time, the insulating distance between the pixel electrode PXL and the common electrode COM is 2000~3000 Å, receptively shorter distance. Consequently, the first embodiment suggests a horizontal electric field type liquid crystal display panel having a high aperture ratio in which the parasitic capacitance is minimized and the driving power consumption is reduced.

Hereinafter, referring to FIG. 1 and FIGS. 3A to 3G, the second embodiment of the present disclosure will be explained. FIGS. 3A to 3G are cross-sectional views illustrating the steps of manufacturing the horizontal electric field type liquid crystal display panel of FIG. 1 by cutting along the line I-I', according to the second embodiment of the present disclosure. In the second embodiment, there is no difference in the plane structure with the first embodiment, but due to the difference of the manufacturing steps, there is difference in the cross-sectional structure.

Figure 3A:
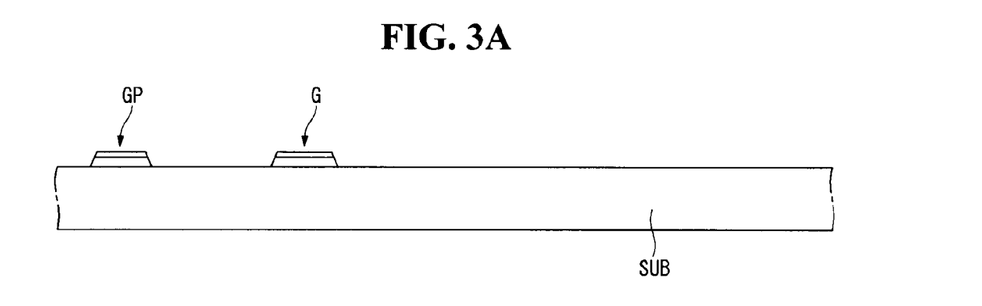
FIGS. 3A to 3G are cross-sectional views illustrating the steps of manufacturing the horizontal electric field type liquid crystal display panel of FIG. 1 by cutting along the line I-I', according to the second embodiment of the present disclosure.

As shown in FIG. 3A, on a transparent substrate SUB, a metal material is deposited and patterned using a first mask process to form gate elements. The gate elements includes a gate line GL running in horizontal direction on the substrate SUB, a gate electrode G protruding from the gate line GL into the pixel area, and a gate pad GP formed at one end of the gate line GL. Especially, the gate elements comprise a first metal layer having copper (Cu) for low electric resistance, and a second metal layer on the first metal layer for protecting the copper material of the first metal layer.

Figure 3B:
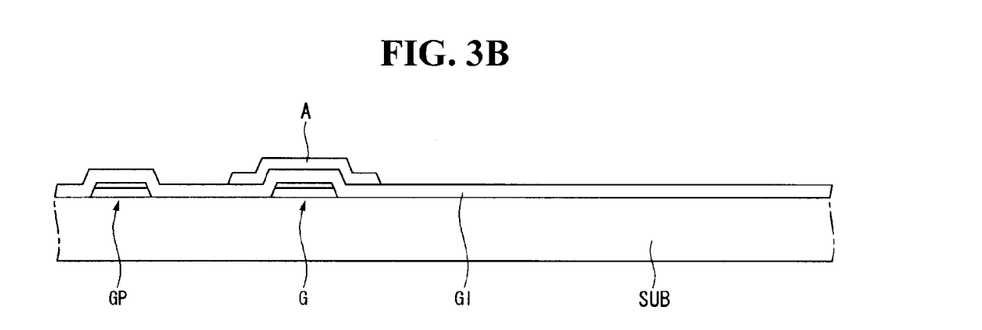

As shown in FIG. 3B, on the whole surface of the substrate SUB having the gate elements, a gate insulating layer GI and a semiconductor material SE are sequentially deposited. By patterning the semiconductor layer SE with the second mask process to form a channel layer A. The channel layer A is overlapping with the gate electrode G with the gate insulating layer GI therebetween.

Figure 3C:
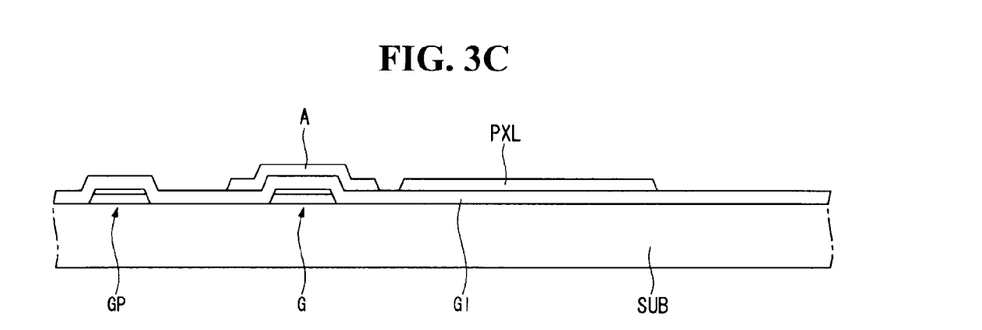

On the whole surface of the substrate SUB having the channel layer A, a transparent conductive material such as ITO (Indium Tin Oxide) and IZO (Indium Zinc Oxide) is deposited and patterned with the third mask process to form a pixel electrode PXL. The pixel electrode PXL has a rectangular shape covering over all areas of the pixel area, as shown in FIG. 3C.

Figure 3D:
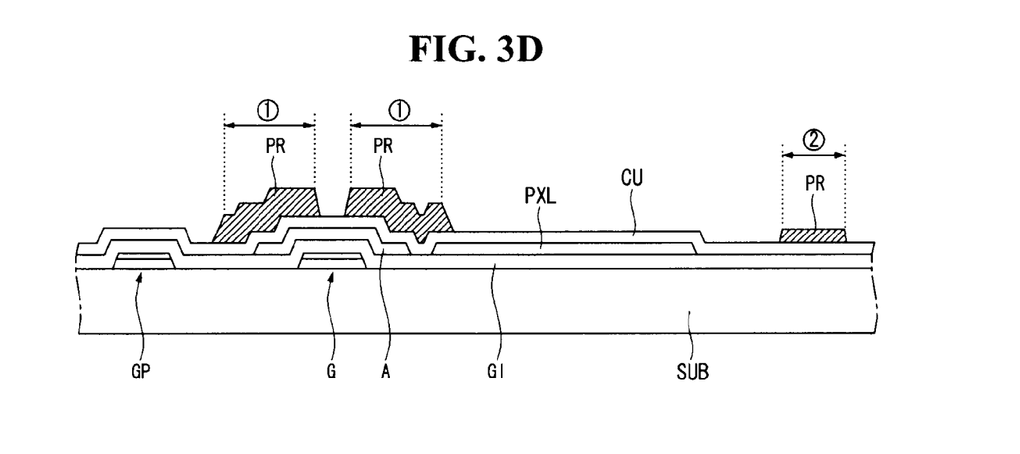

On the substrate SUB having the pixel electrode PXL, a source-drain metal material CU is deposited. On the source-drain metal material CU, a photo acryl is deposited. Using the fourth mask process, the photo acryl pattern PR is formed. In the fourth mask process, a half-tone mask having two regions is used. As a result, the photo acryl pattern PR having two regions is formed in a manner that the first region has the highest thickness and the second region has the lowest thickness. At the first region ①, the source-drain metal material CU and the photo acryl will be remained. At the second region ②, only the source-drain metal material CU SE will be remained, as shown in FIG. 3D.

Figure 3E:
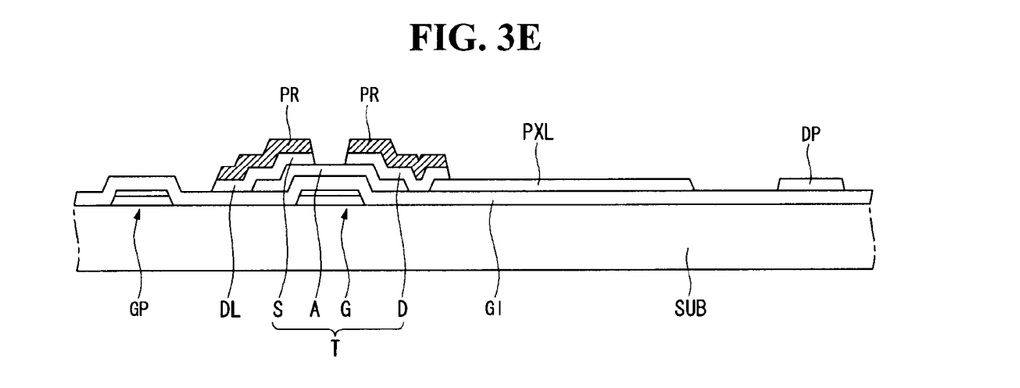

Using the photo acryl pattern PR, the source-drain metal material CU is patterned. As a result, a data line DL running in vertical direction on the substrate SUB, a source electrode S branching from the data line DL and contacting one side of the channel layer A, a drain electrode D facing with the source electrode S and contacting the other side of the channel layer as well the pixel electrode PXL, and a data pad DP formed at one end of the data line DL are formed. After forming the source electrode S and the drain electrode D of the thin film transistor T, the photo acryl pattern PR is thinned by ashing the photo acryl pattern PR to remove the thickness of the second region ②. That is, the first region ① has the thickness which is subtracted with the thickness of the second region ②. At the second region ② the source-drain metal material CU is exposed by removing the photo acryl pattern PR. Whist, on the data line DL, the source electrode S and the drain electrode D, the photo acryl pattern PR is remained to form an additional insulating layer, as shown in FIG. 3E. The photo acryl pattern PR would preferably have the thickness of 1000~2000 Å to utilize the remained photo acryl pattern PR as a shielding layer for the data line DL.

Figure 3F:
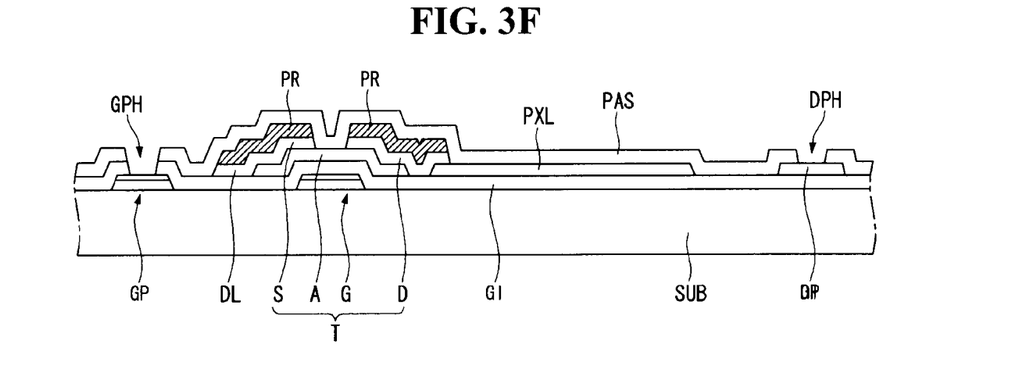

On the substrate SUB having the thin film transistor T, an inorganic insulating material such as SiNx or SiOx is deposited with the thickness of 2000~3000 Å to form a passivation layer PAS. Using the fifth mask process, the passivation layer PAS and the gate insulating layer GI are patterned. By removing some portions of the passivation layer PAS and the gate insulating layer GI covering the gate pad GP, a gate contact hole GHP exposing the gate pad GP is formed. At the same time, by removing some portions of the passivation layer PAS covering the data pad DP, a data pad contact hole DPH exposing the data pad DP is formed, as shown in FIG. 3F.

Figure 3G:
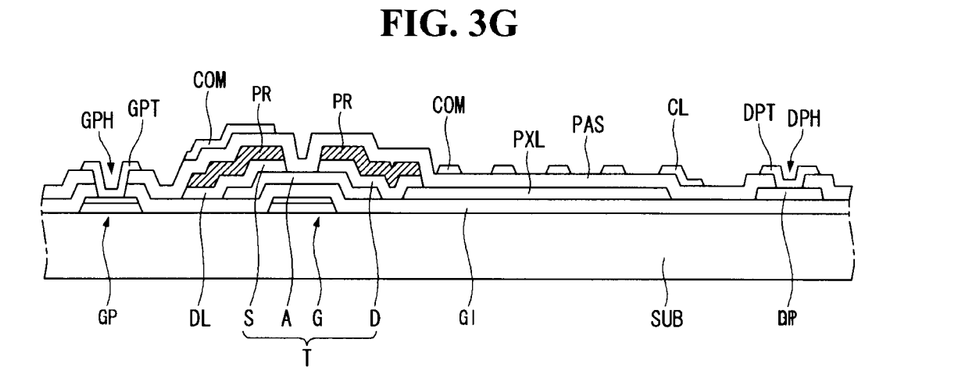

On the whole surface of the substrate SUB, a transparent conductive material such as ITO (Indium Tin Oxide) and IZO (Indium Zinc Oxide) is deposited and patterned by the sixth mask process to form a common electrode COM, a gate pad terminal GPT and a data pad terminal DPT. The gate pad terminal GPT is connected to the gate pad GP via the gate pad contact hole GPH. The data pad terminal DPT in connected to the data pad DP via the data pad contact hole DPH. The common electrode COM has a segment portion completely covering the data line DL and a plurality of segments having a predetermined width and parallely arrayed each other with a predetermined gap within the pixel area. The common electrode COM has a structure comparing a plurality of comb pattern ribs. Furthermore, the common electrode COM is branching from a common line CL running in parallel with the gate line GL, as shown in FIG. 3G.

In the explanation for the second embodiment, the method for manufacturing the fringe type horizontal electric field liquid crystal display panel comprises the six mask processes. Especially, the photo acryl pattern PR, the additional insulating layer, is the photoresist material used in a photo-etching process, therefore the additional insulating layer can be formed without any additional manufacturing step. As a result, the manufacturing process can be simplified and the manufacturing cost is not increased.

Figure 5:
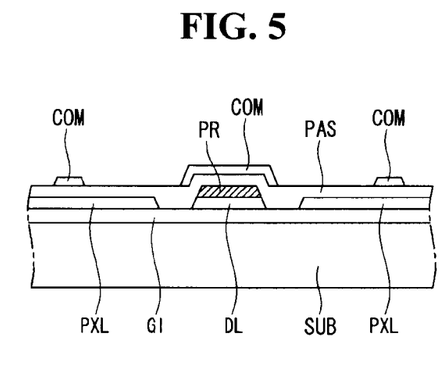
FIG. 5 is an enlarged cross-sectional view illustrating a structure of the data line of the horizontal electric field liquid crystal display panel of FIG. 1 by cutting along the line II-II', according to the second embodiment of the present disclosure.

Furthermore, the portion having the data line DL in the horizontal electric field type liquid crystal display panel according to the first embodiment will be explained in detail. FIG. 5 is an enlarged cross-sectional view illustrating a structure of the data line of the horizontal electric field liquid crystal display panel of FIG. 1 by cutting along the line II-II', according to the second embodiment of the present disclosure.

Within the pixel area on the substrate SUB, the gate elements and the source-drain elements are formed having a gate insulating layer GI therebetween. As shown in FIG. 5, the data line DL is formed on the gate insulating layer GI, and the pixel electrodes PXL are formed in the pixel areas at the left and right sides of the data line DL. In the second embodiment, the data line DL has a single layer structure having the source-drain metal material CU. On the upper surface of the data line DL, the photo acryl pattern PR having the photo acryl material is disposed. On the photo acryl pattern PR, a passivation layer PAS is formed to cover all surfaces of the substrate SUB. On the passivation layer PAS, the common electrode COM is formed as covering the data line DL completely. Within the pixel area, the common electrode COM is overlapping with the pixel electrode PXL. Therefore, due to the fringe field formed between the common electrode COM and the pixel electrode PXL, the horizontal electric field is formed on the substrate SUB.

With the structure according to the second embodiment, it is also possible to solve the problems as the first embodiment does. Especially, in order to solve the problem, the photo acryl pattern PR is formed on the data line DL. As the second embodiment has the same structure with the first embodiment, the insulating distance between the data line DL and the common electrode COM is 3000~5000 Å while the net dielectric property is about 4 F/m, so that it is possible to minimize the parasitic capacitance. At the same time, the insulating distance between the pixel electrode PXL and the common electrode COM is 2000~3000 Å, respectively shorter distance. Consequently, the second embodiment also suggests a horizontal electric field type liquid crystal display panel having a high aperture ratio in which the parasitic capacitance is minimized and the driving power consumption is reduced.

In the horizontal electric field type liquid crystal display panel according to the present disclosure, it is required to further reduce the line electric resistance of the data line DL in order for lowering the power consumption and for manufacturing larger display panel. To do so, it is preferable to use the copper material or the copper-alloy material for the data line DL. However, when the data line is made of the material having copper, the copper material should contact the photo acryl material directly. If the display panel with this structure is used for a long time, the data line DL can be eroded by the reaction with the photo acryl. As a result, it may cause that the reliability of the display panel is lowered and the service life time would be reduced.

In order to solve this problem, it is preferable to make the data line with a double layer structure. For example, when the source-drain metal material is deposited, a first metal layer having the copper material is firstly deposited and then a second metal layer having molibdeium (Mo), titanium (Ti), chromium (Cr) or any alloy of them is deposited sequentially.

Figure 6:
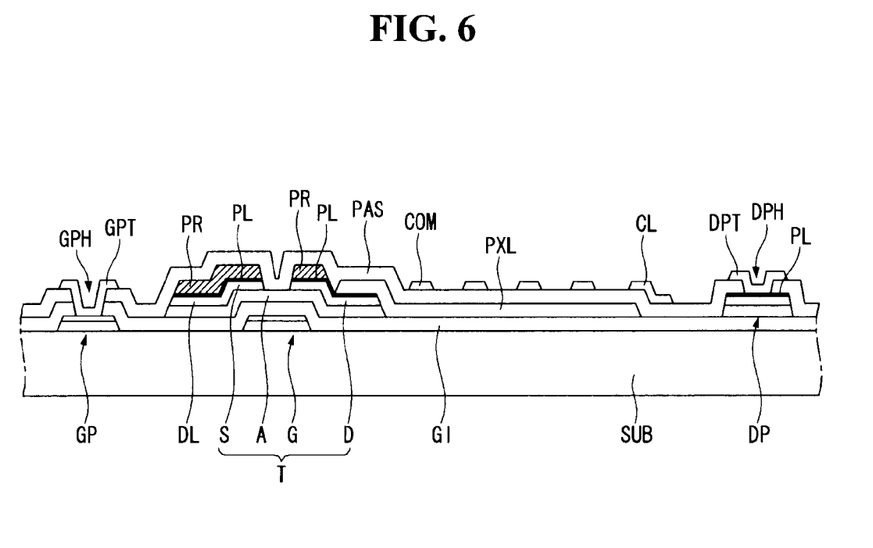
FIG. 6 is a cross-sectional view illustrating the structure of the horizontal electric field liquid crystal display panel having an additional metal layer for protecting the data line in the first embodiment of the present disclosure.
Figure 7:
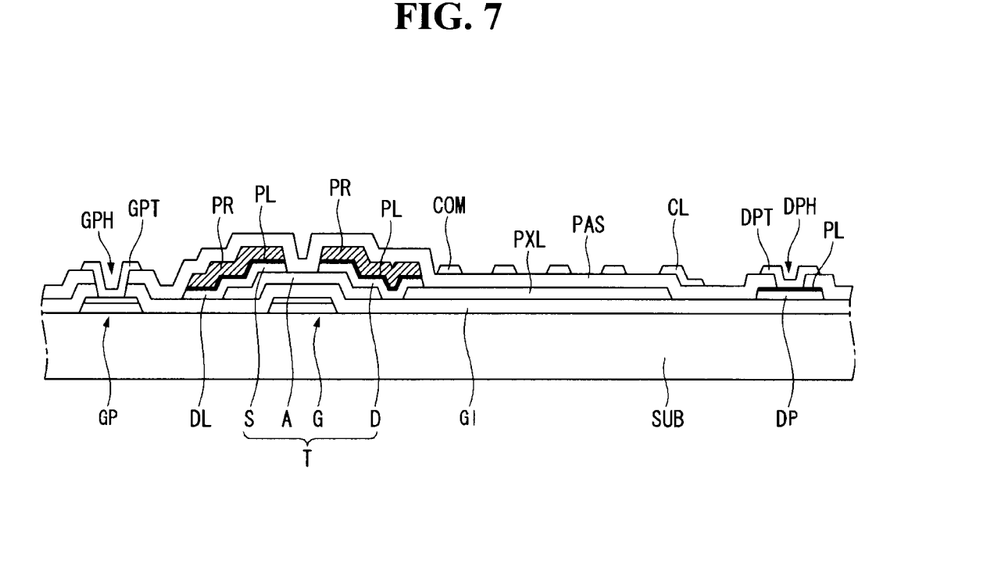
FIG. 7 is a cross sectional view illustrating the structure of the horizontal electric field liquid crystal display panel having an additional metal layer for protecting the data line in the second embodiment of the present disclosure.

The second metal layer can be included in the first and second embodiments, respectively. FIG. 6 is a cross-sectional view illustrating the structure of the horizontal electric field liquid crystal display panel having an additional metal layer for protecting the data line in the first embodiment of the present disclosure. FIG. 7 is a cross sectional view illustrating the structure of the horizontal electric field liquid crystal display panel having an additional metal layer for protecting the data line in the second embodiment of the present disclosure. Referring to FIGS. 6 and 7, on the data line DL, a protective metal layer PL is formed for preventing from the eroding of the data line DL. Especially, as the purpose of the protective layer PL is for protecting the data line DL having copper material, it is enough for the protective layer PL to have thickness of 300~500 Å.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A horizontal electric field type liquid crystal display device comprising:
    a substrate;
    a gate line disposed in horizontal direction on the substrate;
    a gate insulating layer covering the gate line;
    a data line disposed in vertical direction on the gate insulating layer;
    an additional insulating layer on the data line having same size and shape with the data line;
    a passivation layer covering the additional insulating layer; and
    a common electrode overlapping with the data line on the passivation layer.

2. The device according to the claim 1, wherein the additional insulating layer includes a photo acryl; and the insulating layer includes at least one of silicon nitride and silicon oxide.

3. The device according to the claim 1, wherein the additional insulating layer has a thickness of 1000~2000 Å; and the insulating layer has a thickness of 2000~3000 Å.

4. The device according to the claim 1, wherein the data line includes a copper material.

5. The device according to the claim 1, further comprising:
a protective metal layer having same shape and size with the data line between the data line and the additional insulating layer.

6. The device according to the claim 5, wherein the protective metal layer includes at least one of molibdeium, titanium and chromium.

7. The device according to the claim 5, wherein the protective metal layer has a thickness of 300~500 Å.

8. The device according to the claim 1, further comprising:
a gate electrode branching from the gate line;
a channel layer overlapping with the gate electrode on the gate insulating layer;
a source electrode branching from the data line and contacting a first side of the channel layer;
a drain electrode facing with the source electrode and contacting a second side of the channel layer; and
a pixel electrode contacting some portions of the drain electrode and having a rectangular shape within a pixel area defined by the gate line and the data line,
wherein the common electrode further includes a comb ribs pattern in which a plurality of segments having a predetermined width are arrayed in parallel with a predetermined gap, within the pixel area.

\* \* \* \* \*